United States Patent
Inoue et al.

(10) Patent No.: US 10,475,831 B2
(45) Date of Patent: Nov. 12, 2019

(54) SOLID-STATE IMAGE SENSING DEVICE, ELECTRONIC DEVICE, AND METHOD FOR MANUFACTURING SOLID-STATE IMAGE SENSING DEVICE

(71) Applicant: SONY SEMICONDUCTOR SOLUTIONS CORPORATION, Kanagawa (JP)

(72) Inventors: Susumu Inoue, Kanagawa (JP); Yuhi Yorikado, Kanagawa (JP); Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/580,817

(22) PCT Filed: Sep. 5, 2016

(86) PCT No.: PCT/JP2016/075936
§ 371 (c)(1),
(2) Date: Dec. 8, 2017

(87) PCT Pub. No.: WO2017/047422
PCT Pub. Date: Mar. 23, 2017

(65) Prior Publication Data
US 2018/0182789 A1   Jun. 28, 2018

(30) Foreign Application Priority Data

Sep. 17, 2015   (JP) ................. 2015-184538

(51) Int. Cl.
*H01L 27/146* (2006.01)
*H01L 31/0352* (2006.01)
(Continued)

(52) U.S. Cl.
CPC .... *H01L 27/1462* (2013.01); *H01L 21/02107* (2013.01); *H01L 21/02178* (2013.01);
(Continued)

(58) Field of Classification Search
CPC ........... H01L 27/14647; H01L 27/1461; H01L 27/14689; H01L 27/1464; H01L 27/14638;
(Continued)

(56) References Cited

U.S. PATENT DOCUMENTS 5,538,564 A * 7/1996 Kaschmitter ..... H01L 31/03529
136/255
6,034,321 A * 3/2000 Jenkins ........... H01L 31/022433
136/252

(Continued)

FOREIGN PATENT DOCUMENTS

AT   434835 T   7/2009
CN   101794798 A   8/2010
(Continued)

OTHER PUBLICATIONS

International Search Report and Written Opinion of PCT Application No. PCT/JP2016/075936, dated Nov. 29, 2016, 10 pages.

(Continued)

*Primary Examiner* — Sophia T Nguyen
(74) *Attorney, Agent, or Firm* — Chip Law Group

(57) ABSTRACT

The present technology relates to a solid-state image sensing device for preventing a reduction in light receiving sensitivity of an avalanche photodiode, an electronic device, and a method for manufacturing the solid-state image sensing device. A solid-state image sensing device includes an avalanche photodiode having a first region of a first conductive type, a second region of a second conductive type different from the first conductive type, and an avalanche (Continued)

region sandwiched between the first region and the second region, which extend in a thickness direction of a semiconductor substrate, and a film formed on at least one side of the semiconductor substrate and including a metal oxide film, a metal nitride film, or a mix crystal-based film of metal oxide film and metal nitride film. The present technology can be applied to CMOS image sensors, for example.

11 Claims, 12 Drawing Sheets

(51) Int. Cl.
  H01L 31/107 (2006.01)
  H01L 31/0224 (2006.01)
  H04N 9/04 (2006.01)
  H01L 31/101 (2006.01)
  H01L 31/02 (2006.01)
  H01L 31/0216 (2014.01)
  H01L 21/02 (2006.01)
  H01L 31/18 (2006.01)
  H01L 31/028 (2006.01)
  H01L 31/0304 (2006.01)

(52) U.S. Cl.
  CPC .. *H01L 21/02181* (2013.01); *H01L 21/02183* (2013.01); *H01L 21/02189* (2013.01); *H01L 21/02192* (2013.01); *H01L 27/1461* (2013.01); *H01L 27/1463* (2013.01); *H01L 27/1464* (2013.01); *H01L 27/14607* (2013.01); *H01L 27/14636* (2013.01); *H01L 27/14638* (2013.01); *H01L 27/14685* (2013.01); *H01L 27/14689* (2013.01); *H01L 31/02005* (2013.01); *H01L 31/02027* (2013.01); *H01L 31/02162* (2013.01); *H01L 31/022408* (2013.01); *H01L 31/0352* (2013.01); *H01L 31/03529* (2013.01); *H01L 31/035263* (2013.01); *H01L 31/107* (2013.01); *H01L 31/1013* (2013.01); *H04N 9/0451* (2018.08); *H01L 27/14621* (2013.01); *H01L 27/14627* (2013.01); *H01L 27/14647* (2013.01); *H01L 31/028* (2013.01); *H01L 31/0304* (2013.01); *H01L 31/1804* (2013.01); *H01L 31/184* (2013.01); *H01L 31/1808* (2013.01)

(58) Field of Classification Search
  CPC ............ H01L 27/14636; H01L 31/107; H01L 31/035263; H01L 31/0352; H01L 31/03529; H01L 31/1013; H01L 31/1804; H01L 31/028; H01L 31/02027; H01L 31/02005; H01L 31/022408; H01L 21/02107; H01L 21/02178; H01L 21/02181; H01L 21/02183; H01L 21/02189; H01L 21/02192; H04N 5/374
  See application file for complete search history.

(56) References Cited

U.S. PATENT DOCUMENTS

| | | | | |
|---|---|---|---|---|
| 6,111,305 A * | 8/2000 | Yoshida | H01L 31/03529 | 257/458 |
| 6,136,628 A * | 10/2000 | Sugiyama | H01L 31/107 | 257/E31.063 |
| 6,204,087 B1 * | 3/2001 | Parker | H01L 27/1446 | 257/E27.129 |
| 6,392,282 B1 * | 5/2002 | Sahara | H01L 27/1443 | 257/186 |
| 6,700,175 B1 * | 3/2004 | Kodama | H01L 29/0634 | 257/489 |
| 7,462,553 B2 * | 12/2008 | Metzler | H01L 27/1446 | 257/E27.129 |
| 7,576,371 B1 * | 8/2009 | Goushcha | H01L 27/1463 | 257/184 |
| 7,719,091 B2 * | 5/2010 | Brogle | H01L 29/0692 | 257/656 |
| 7,939,359 B2 * | 5/2011 | Ohgishi | H01L 27/1462 | 257/439 |
| 8,344,468 B2 * | 1/2013 | Roizin | H01L 27/1421 | 136/244 |
| 8,378,399 B2 * | 2/2013 | Maeda | H04N 5/37457 | 257/292 |
| 9,111,993 B1 * | 8/2015 | Zheng | H01L 21/76224 | |
| 9,209,320 B1 * | 12/2015 | Webster | H01L 31/02027 | |
| 9,224,881 B2 * | 12/2015 | Hsiung | H01L 31/02161 | |
| 9,653,502 B2 * | 5/2017 | Yoshitsugu | H01L 27/14623 | |
| 9,748,288 B2 * | 8/2017 | Baek | H01L 31/047 | |
| 2003/0183855 A1 * | 10/2003 | Dries | H01L 31/02024 | 257/200 |
| 2005/0230706 A1 * | 10/2005 | Yagyu | H01L 31/107 | 257/186 |
| 2006/0081874 A1 * | 4/2006 | Francis | H01L 31/03529 | 257/186 |
| 2006/0121683 A1 * | 6/2006 | Francis | H01L 31/107 | 438/380 |
| 2008/0121867 A1 * | 5/2008 | Yagyu | H01L 31/035281 | 257/21 |
| 2008/0150069 A1 | 6/2008 | Popovic et al. | | |
| 2008/0308890 A1 * | 12/2008 | Uya | H01L 27/14603 | 257/437 |
| 2009/0038669 A1 * | 2/2009 | Atanackovic | H01L 21/76254 | 136/244 |
| 2009/0096049 A1 * | 4/2009 | Oshiyama | H01L 27/1461 | 257/432 |
| 2009/0189235 A1 * | 7/2009 | Ikeda | H01L 27/1461 | 257/432 |
| 2010/0177223 A1 * | 7/2010 | Rennie | H01L 27/14603 | 348/294 |
| 2010/0245809 A1 * | 9/2010 | Andreou | H01L 27/14603 | 356/222 |
| 2011/0024608 A1 * | 2/2011 | Assefa | H01L 31/107 | 250/214 A |
| 2011/0025872 A1 * | 2/2011 | Oshiyama | H01L 27/14601 | 348/222.1 |
| 2011/0140177 A1 | 6/2011 | Yamashita | | |
| 2011/0233708 A1 * | 9/2011 | Washino | H01L 31/02161 | 257/436 |
| 2012/0049242 A1 * | 3/2012 | Atanackovic | H01L 31/022441 | 257/184 |
| 2012/0147241 A1 * | 6/2012 | Yamaguchi | H01L 27/14609 | 348/311 |
| 2013/0026604 A1 * | 1/2013 | Hsin | H01L 31/03529 | 257/603 |
| 2013/0099091 A1 * | 4/2013 | Nemirovsky | H01L 31/024 | 250/206 |
| 2013/0285130 A1 * | 10/2013 | Ting | H01L 27/146 | 257/291 |
| 2013/0320479 A1 * | 12/2013 | Ahn | H01L 31/02 | 257/460 |
| 2014/0084348 A1 | 3/2014 | Yamashita | | |
| 2014/0117485 A1 * | 5/2014 | Rhodes | H01L 27/14643 | 257/443 |
| 2014/0131827 A1 * | 5/2014 | Yamaguchi | H01L 31/1075 | 257/438 |
| 2014/0138787 A1 * | 5/2014 | Hellings | H01L 31/022408 | 257/432 |
| 2014/0186991 A1 * | 7/2014 | Huang | H01L 31/107 | 438/91 |
| 2014/0191115 A1 * | 7/2014 | Webster | H01L 31/107 | 250/214 R |
| 2014/0306311 A1 * | 10/2014 | Funao | H01L 27/1461 | 257/432 |
| 2014/0312449 A1 * | 10/2014 | Jonak-Auer | H01L 27/14609 | 257/438 |

(56) References Cited

U.S. PATENT DOCUMENTS

| | | | |
|---|---|---|---|
| 2015/0036031 A1* | 2/2015 | Kamimura | H01L 27/1461 348/294 |
| 2015/0053923 A1* | 2/2015 | Frey | H01L 31/02327 257/21 |
| 2015/0076641 A1* | 3/2015 | Huang | H01L 31/022416 257/432 |
| 2015/0108327 A1* | 4/2015 | Huang | H01L 31/022408 250/200 |
| 2015/0333210 A1* | 11/2015 | Teva | H01L 31/022408 257/438 |
| 2016/0035929 A1* | 2/2016 | Teva | H01L 31/022408 257/49 |
| 2016/0163897 A1* | 6/2016 | Sakai | H01L 31/03529 257/446 |
| 2016/0204156 A1* | 7/2016 | Togashi | H01L 23/481 257/292 |
| 2016/0204298 A1* | 7/2016 | Chen | H01L 31/02327 257/432 |
| 2016/0284828 A1* | 9/2016 | Shimizu | H01L 29/7786 |
| 2016/0284830 A1* | 9/2016 | Shimizu | H01L 29/408 |
| 2016/0300838 A1* | 10/2016 | Zhang | H01L 21/84 |
| 2016/0329364 A1* | 11/2016 | Tsai | H01L 27/1464 |
| 2016/0353084 A1* | 12/2016 | Sun | H04N 5/374 |
| 2017/0141144 A1* | 5/2017 | Yamakawa | H01L 27/1461 |
| 2018/0040663 A1* | 2/2018 | Donnelly | H01L 27/11807 |
| 2018/0108800 A1* | 4/2018 | Morimoto | B60W 30/00 |
| 2018/0182789 A1* | 6/2018 | Inoue | H01L 31/10 |
| 2018/0211990 A1* | 7/2018 | Yorikado | G02B 3/00 |
| 2018/0366504 A1* | 12/2018 | Jin | H01L 27/14614 |

FOREIGN PATENT DOCUMENTS

| | | |
|---|---|---|
| CN | 102104051 A | 6/2011 |
| DE | 602006007438 D1 | 11/2007 |
| EP | 1679749 A1 | 7/2006 |
| EP | 1839343 A1 | 10/2007 |
| JP | 04-291968 A | 10/1992 |
| JP | 07-162027 A | 6/1995 |
| JP | 08-288524 A | 11/1996 |
| JP | 2008-527702 A | 7/2008 |
| JP | 2010-157665 A | 7/2010 |
| JP | 2011-129637 A | 6/2011 |
| JP | 2011-166394 A | 8/2011 |
| TW | 201125110 A | 7/2011 |
| WO | 2006/074990 A1 | 7/2006 |

OTHER PUBLICATIONS

Extended European Search Report of EP Application No. 16846293.5, dated Apr. 11, 2019, 06 pages.

* cited by examiner

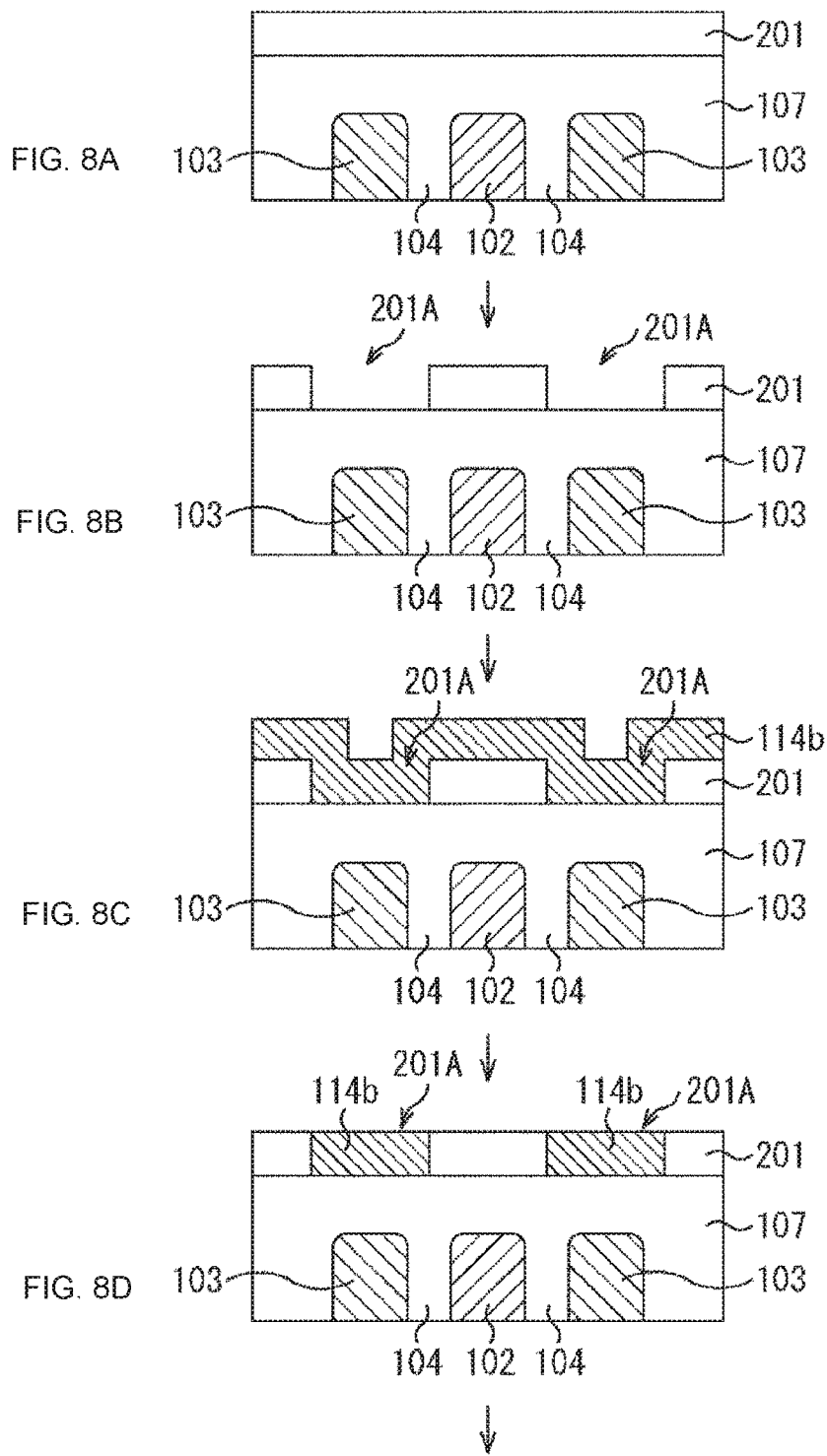

SOLID-STATE IMAGE SENSING DEVICE, ELECTRONIC DEVICE, AND METHOD FOR MANUFACTURING SOLID-STATE IMAGE SENSING DEVICE

CROSS REFERENCE TO RELATED APPLICATIONS

This application is a U.S. National Phase of International Patent Application No. PCT/JP2016/075936 filed on Sep. 5, 2016, which claims priority benefit of Japanese Patent Application No. JP 2015-184538 filed in the Japan Patent Office on Sep. 17, 2015. Each of the above-referenced applications is hereby incorporated herein by reference in its entirety.

TECHNICAL FIELD

The present technology relates to a solid-state image sensing device, an electronic device, and a method for manufacturing the solid-state image sensing device, and particularly to a solid-state image sensing device using avalanche multiplication, an electronic device, and a method for manufacturing the solid-state image sensing device.

BACKGROUND ART

In recent years, a pixel size has been reduced in order to realize smaller and finer solid-state image sensing devices. When an image size is reduced, however, not only a light receiving area of a photodiode as light receiving device but also a volume of a region for photoelectric conversion is reduced, and thus a light receiving efficiency lowers.

On the other hand, higher sensitivity of solid-state image sensing devices is desired in order to shoot an image with high image quality even in a state with less incident light, such as shooting a dark place or detecting a slight amount of radiation.

To the contrary, there is proposed a solid-state image sensing device using avalanche photodiodes by use of avalanche multiplication in order to achieve both downsizing and higher sensitivity (see Patent Document 1, for example).

CITATION LIST

Patent Document

Patent Document 1: Japanese Patent Application Laid-Open No. 2010-157665

SUMMARY OF THE INVENTION

Problems to be Solved by the Invention

Incidentally, in an avalanche photodiode driven in a Geiger mode, a bias voltage near a fall voltage of a diode is applied thereby to have sensitivity to single photons. Thus, the fall voltage of a diode is an important parameter.

On the other hand, a curvature of an electric field intensity is higher at an end of a pn junction in an avalanche photodiode, and the fall voltage lowers. This is a phenomenon called edge effect or fringe effect. For example, according to the invention described in Patent Document 1, an end of a pn junction is present on a surface of a semiconductor substrate on which an avalanche photodiode is formed. Consequently, outward diffusion or pile-up of impurities easily occurs on the surface of the semiconductor substrate, and the fall voltage lowers.

Then, if a bias voltage is applied according to a region where the fall voltage lowers, for example, only a lower voltage than the fall voltage is applied in other regions. Consequently, light receiving sensitivity of avalanche photodiodes lowers.

To the contrary, it has been conventionally proposed that a low-concentration region is provided to alleviate an impurity concentration gradient and the like. However, if a low-concentration region is formed near a surface of the semiconductor substrate, light receiving sensitivity to short-wavelength incident lights lowers.

The present technology has been made in terms of the situations, and is directed for preventing a reduction in light receiving sensitivity of avalanche photodiodes.

Solutions to Problems

A solid-state image sensing device according to a first aspect of the present technology includes an avalanche photodiode having a first region of a first conductive type, a second region of a second conductive type different from the first conductive type, and an avalanche region sandwiched between the first region and the second region, which extend in a thickness direction of a semiconductor substrate, and a film formed on at least one side of the semiconductor substrate and including a metal oxide film, a metal nitride film, or a mix crystal-based film of metal oxide film and metal nitride film.

An insulating film formed between the film and the semiconductor substrate can be further provided.

The film can include an oxide film or nitride film of aluminum, tantalum, zirconium, hafnium, yttrium, or lanthanoid, or a mix crystal-based film of oxide and nitride of aluminum, tantalum, zirconium, hafnium, yttrium, or lanthanoid.

The film can have fixed charges.

The film can have different fixed charges between near the first region and near the second region.

In a case where the first region is in a rectangular tube shape, the film can be formed to cover at least around corners of the first region.

The first region is cylindrical, an electrode formed along the upper face or the bottom face of the first region and having one or more discontinuous parts can be further provided on one side of the semiconductor substrate, and the film can be formed to cover at least around the discontinuous parts in the electrode between the semiconductor substrate and the electrode.

Two or more avalanche photodiode structures can be repeatedly formed in one pixel.

A method for manufacturing a solid-state image sensing device according to a second aspect of the present technology includes a step of forming a film including a metal oxide film, a metal nitride film, or a mix crystal-based film of metal oxide film and metal nitride film on at least one side of a semiconductor substrate on which an avalanche photodiode having a first region of a first conductive type, a second region of a second conductive type different from the first conductive type, and an avalanche region sandwiched between the first region and the second region, which extend in a thickness direction of the semiconductor substrate, is formed.

An electronic device according to a third aspect of the present technology includes a solid-state image sensing device, and a signal processing unit for processing a signal output from the solid-state image sensing device, in which the solid-state image sensing device includes an avalanche photodiode having a first region of a first conductive type, a second region of a second conductive type different from the first conductive type, and an avalanche region sandwiched between the first region and the second region, which extend in a thickness direction of a semiconductor substrate, and a film formed on at least one side of the semiconductor substrate and including a metal oxide film, a metal nitride film, or a mix crystal-based film of metal oxide film and metal nitride film.

According to the first or third aspect of the present technology, a film including a metal oxide film, a metal nitride film, or a mix crystal-based film of metal oxide film and metal nitride film, which is formed on at least one side of a semiconductor substrate, enables a variation in fall voltage or an occurrence in dark current in an avalanche photodiode to be restricted.

According to the second aspect of the present technology, a film including a metal oxide film, a metal nitride film, or a mix crystal-based film of metal oxide film and metal nitride film is formed on at least one side of a semiconductor substrate on which an avalanche photodiode having a first region of a first conductive type, a second region of a second conductive type different from the first conductive type, and an avalanche region sandwiched between the first region and the second region, which extend in a thickness direction of the semiconductor substrate, is formed.

Effects of the Invention

According to the first to third aspects of the present technology, it is possible to prevent a reduction in light receiving sensitivity of avalanche photodiodes.

Additionally, the effects described in the present specification are merely exemplary, and the effects of the present technology are not limited to the effects described in the present specification, and additional effects may be obtained.

BRIEF DESCRIPTION OF DRAWINGS

FIGS. 8A, 8B, 8C, and 8D are diagrams for explaining a method for manufacturing a fixed charge film of the CMOS image sensor of FIG. 7.

MODE FOR CARRYING OUT THE INVENTION

Modes for carrying out the present technology (which will be denoted as embodiments below) will be described below. Additionally, the description will be made in the following order.

1. Solid-state image sensing device to which the present technology is applied
2. First embodiment
3. Second embodiment (example in which insulating films are provided)
4. Third embodiment (example in which fixed charge films with different fixed charges are provided)
5. Variants
6. Exemplary use of solid-state image sensing devices <1. Solid-State Image Sensing Device to which the Present Technology is Applied>

{Basic System Configuration}

Figure 1:
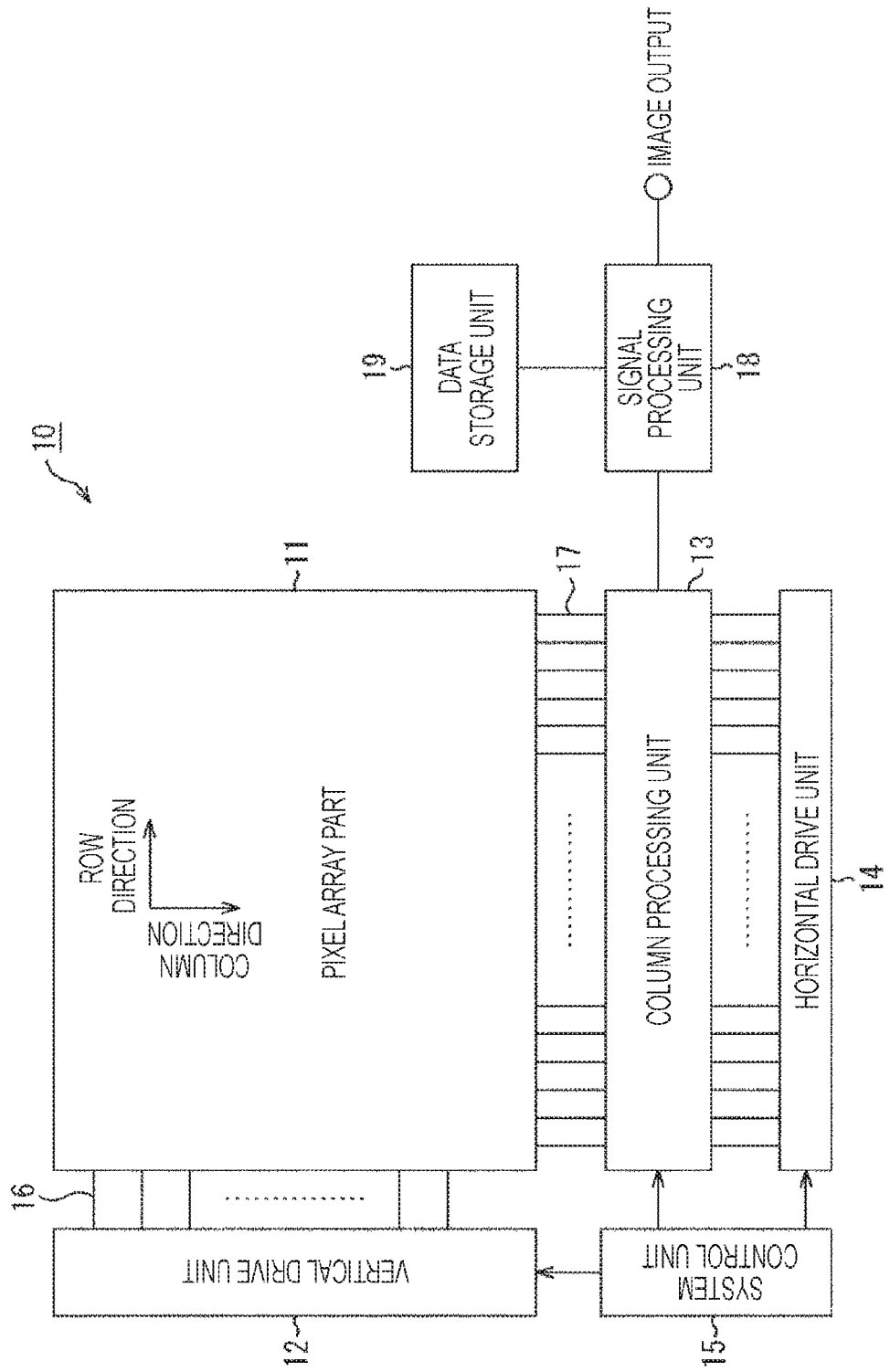
FIG. 1 is a block diagram illustrating an exemplary schematic configuration of a CMOS image sensor to which the present technology is applied.

FIG. 1 is a system configuration diagram illustrating a schematic configuration of a solid-state image sensing device to which the present technology is applied, such as a CMOS image sensor as a kind of solid-state image sensing device of X-Y address system. Here, the CMOS image sensor is created by applying a CMOS process or using part of it.

A CMOS image sensor 10 according to the present application is configured of a pixel array part 11 formed on a semiconductor substrate 107 (FIG. 2), and peripheral circuit units integrated on the same semiconductor substrate 107 as the pixel array part 11. The peripheral circuit units are configured of a vertical drive unit 12, a column processing unit 13, a horizontal drive unit 14, and a system control unit 15, for example.

The CMOS image sensor 10 further includes a signal processing unit 18 and a data storage unit 19. The signal processing unit 18 and the data storage unit 19 may be mounted on the same substrate as the CMOS image sensor 10, or may be arranged on a different substrate from the CMOS image sensor 10. Further, each processing of the signal processing unit 18 and the data storage unit 19 may be performed by an external signal processing unit provided on a different substrate from the CMOS image sensor 10, such as digital signal processor (DSP) circuit or software.

The pixel array part 11 is configured such that a plurality of unit pixels (which will be simply denoted as "pixel" below) are arranged in a row direction and in a column direction. Here, the row direction is a direction in which the pixels in the pixel rows are arranged (or horizontal direction), and the column direction is a direction in which the pixels in the pixel columns are arranged (or vertical direction).

A unit pixel has a photoelectric conversion unit (such as photodiode) for generating and accumulating charges depending on the amount of received light, and a plurality of pixel transistors (or MOS transistors). The plurality of pixel transistors can be configured of three transistors including a transfer transistor, a reset transistor, and an amplification transistor, for example. Alternatively, the plurality of pixel transistors can be configured of the four transistors including a select transistor. Additionally, an equivalent circuit of each pixel is similar to a general one, and a detailed description thereof will be omitted here.

Further, a unit pixel can be in a common pixel structure. The common pixel structure is configured of a plurality of photoelectric conversion units, a plurality of transfer transistors, one shared floating diffusion, and each of the other shared pixel transistors.

In the pixel array part 11, pixel drive lines 16 as row signal lines are arranged in the row direction for the pixel rows, respectively, and vertical signal lines 17 as column signal lines are arranged in the column direction for the pixel columns, respectively. The pixel drive lines 16 transmit a drive signal for driving when reading a signal from a pixel. The pixel drive lines 16 are illustrated as one wiring in FIG. 1, but are not limited to one. An end of a pixel drive line 16 is connected to an output terminal corresponding to each row of the vertical drive unit 12.

The vertical drive unit 12 is configured of a shift register, address decoder, or the like, and drives all the pixels in the pixel array part 11 at the same time, in units of row, or the like. That is, the vertical drive unit 12 configures a drive unit for controlling the operations of each pixel in the pixel array part 11 together with the system control unit 15 for controlling the vertical drive unit 12. A specific configuration of the vertical drive unit 12 is not illustrated, but generally has two scanning systems of read scanning system and sweep scanning system.

The read scanning system selects and scans the unit pixels in the pixel array part 11 in units of row in order to read a signal from a unit pixel. The signal read from a unit pixel is an analog signal. The sweep scanning system sweeps and scans the read rows on which the read scanning system performs read scanning earlier than the read scanning by an exposure time.

Unnecessary charges are swept from the photoelectric conversion unit in a unit pixel in the read row in the sweep scanning by the sweep scanning system thereby to reset the photoelectric conversion unit. Unnecessary charges are then swept (reset) by the sweep scanning system so that an electronic shutter operation is performed. Here, the electronic shutter operation is an operation of discarding charges in the photoelectric conversion unit and newly starting exposure (starting accumulating charges).

A signal read in the read operation by the read scanning system corresponds to the amount of light received after the previous read operation or the electronic shutter operation. Then, a period from a read timing by a previous read operation or a sweep timing by the electronic shutter operation to a read timing by a current read operation is a charge exposure period in the unit pixel.

A signal output from each unit pixel in a pixel row selected and scanned by the vertical drive unit 12 is input into the column processing unit 13 via each of the vertical signal lines 17 per column of pixels. The column processing unit 13 performs a predetermined signal processing on the signal output from each pixel in a selected row via the vertical signal lines 17 and temporarily holds the signal-processed pixel signal per column of pixels in the pixel array part 11.

Specifically, the column processing unit 13 performs at least a noise cancellation processing such as correlated double sampling (CDS) processing or double data sampling (DDS) processing as signal processing. For example, reset noises, or pixel-specific fixed pattern noises such as threshold variation of the amplification transistor in a pixel are canceled by the CDS processing. The column processing unit 13 can have an analog-digital (AD) conversion function, for example, in addition to the noise cancellation processing, and can convert an analog pixel signal into a digital signal and output the digital signal.

The horizontal drive unit 14 is configured of a shift register, address decoder, or the like, and selects a unit circuit corresponding to a pixel column in the column processing unit 13 in turn. With the selecting and scanning by the horizontal drive unit 14, a pixel signal signal-processed per unit circuit in the column processing unit 13 is output in turn.

The system control unit 15 is configured of a timing generator or the like for generating various timing signals, and controls driving the vertical drive unit 12, the column processing unit 13, the horizontal drive unit 14, and the like on the basis of the timings generated by the timing generator.

The signal processing unit 18 has at least a calculation processing function, and performs various types of signal processing such as calculation processing on a pixel signal output from the column processing unit 13. The data storage unit 19 temporarily stores data required for the signal processing in the signal processing unit 18.

<2. First Embodiment>

A CMOS image sensor 10A as a first embodiment of the CMOS image sensor 10 of FIG. 1 will be described below with reference to FIG. 2 to FIG. 4.

{Exemplary Configuration of CMOS Image Sensor 10A}

Figure 2:
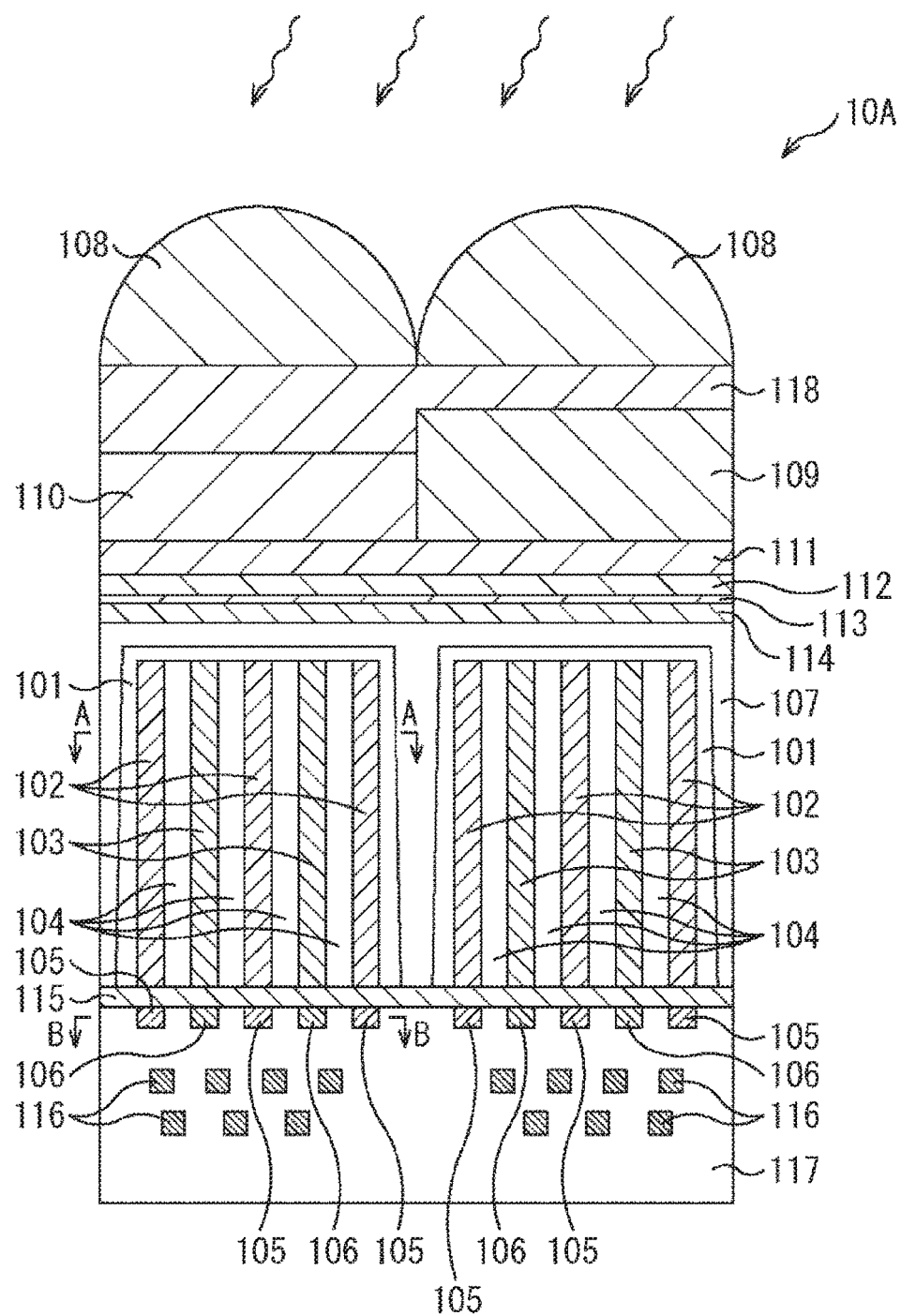
FIG. 2 is a cross-section view illustrating a first embodiment of the CMOS image sensor.

FIG. 2 is a cross-section view schematically illustrating an exemplary configuration of the CMOS image sensor 10A. Additionally, a cross section of a part including two pixels is illustrated in the Figure, but other pixels basically have the same configuration.

In the CMOS image sensor 10A, n-type well layers 101 are formed in a p-type semiconductor substrate 107 to be separated in an island shape per pixel. A photodiode configuring a pixel is formed in an n-type well layer 101.

A fixed charge film 114, a transmissivity/refractivity adjustment layer 113, a passivation layer 112, and a transmissivity/refractivity adjustment layer 111 are laminated on the semiconductor substrate 107, and color filters 109 and 110 of colors corresponding to each pixel are further formed thereon.

On-chip lenses 108 are formed on the color filters 109 and 110 via a planarization layer 118.

On the other hand, a fixed charge film 115 and an insulating layer 117 are laminated below the semiconductor substrate 107, and metal wiring layers 116 are formed in the insulating layer 117. Each metal wiring layer 116 is insulated by the insulating layer 117.

In the CMOS image sensor 10A, the insulating layer 117 provided with the metal wiring layers 116 is formed on the opposite side to the color filters 109, 110 and the on-chip lenses 108 across the semiconductor substrate 107 forming the photodiodes therein. That is, the CMOS image sensor 10A is a solid-state image sensing device of backside irradiation type for irradiating a light on the semiconductor substrate 107 provided with the wirings from the backside opposite to the top side.

Additionally, the backside of the semiconductor substrate 107 will be also called upper face and the top side of the semiconductor substrate 107 will be also called lower face in the following.

According to the present embodiment, particularly a plurality of avalanche photodiode structures each including n+ region 102/avalanche region 104/p+ region 103 are repeatedly formed in one pixel. Specifically, the n+ regions 102, the p+ regions 103, and the avalanche regions 104 are formed to extend in the thickness direction (vertically in FIG. 2) of the semiconductor substrate 107 within an n+ well layer 101. Then, an avalanche region 104 is sandwiched between an n+ region 102 and a p+ region 103 thereby to configure an avalanche photodiode.

Further, as illustrated in FIG. 2, an n+ region 102 or a p+ region 103 is shared between the adjacent structures each including n+ region 102/avalanche region 104/p+ region 103. Thereby, a total of four avalanche regions 104 can be provided in the presence of three n+ regions 102 and the two p+ regions 103.

An n+ region 102 is connected to an electrode (cathode electrode) 105 formed in the lower insulating layer 117 via a wiring or the like (not illustrated). A p+ region 103 is connected to an electrode (anode electrode) 106 formed in the lower insulating layer 117 via a wiring or the like (not illustrated). Each electrode 105 is connected at a different part from the cross section of FIG. 2, and is set at the same potential. The electrodes 106 are similarly connected and set.

Further, the heights of the upper faces of the n+ regions 102, the p+ regions 103, and the avalanche regions 104 configuring an avalanche photodiode are almost the same, and the upper faces are covered with the n+ well layer 101 and the semiconductor substrate 107.

Figure 3:
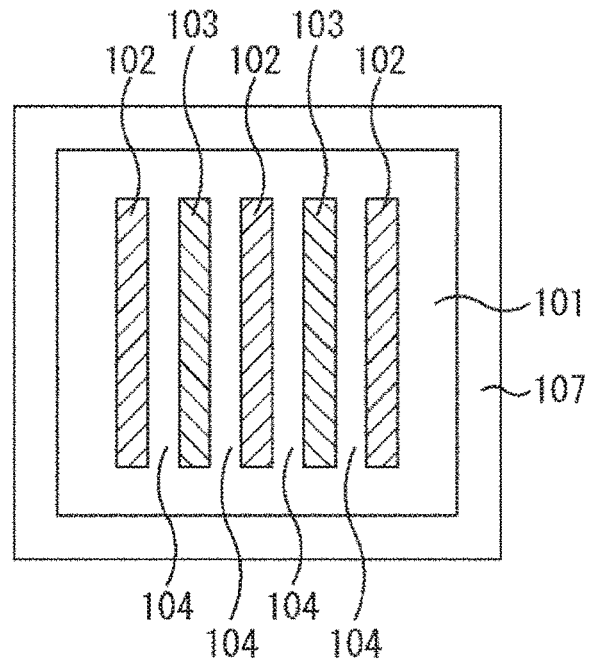
FIG. 3 is a diagram illustrating an exemplary plane pattern of an avalanche photodiode.

FIG. 3 illustrates a horizontal cross-section view along the line A-A in FIG. 2. The horizontal direction in FIG. 3 corresponds to the horizontal direction in FIG. 2, and the vertical direction corresponds to a direction perpendicular to the sheet of FIG. 2.

The n+ regions 102, the p+ regions 103, and the avalanche regions 104 configuring an avalanche photodiode are formed to extend in parallel with each other in both the cross section of FIG. 2 and the cross section of FIG. 3.

Further, a relationship between a voltage (potential difference) given to the n+ regions 102 and the p+ regions 103 and an electric field to be formed is determined by the width of the avalanche region 104 in FIG. 2 and FIG. 3. As the width of the avalanche region 104 is smaller, a required voltage can be made smaller. The width of the avalanche region 104 is set between 0.05 µm and 1 µm, for example.

n-type or p-type impurity-doped silicon can be used for the semiconductor substrate 107. Further, Ge, GaAs, InP, GaP, InAs, GaSb, and InSb as well as semiconductor materials with wider band gap including three elements or four elements can be used.

The avalanche region 104 is configured of a low-concentration impurity (n type or p type)-doped region, or a non-doped region.

For example, the n+ regions 102, the p+ regions 103, and the avalanche regions 104 configuring an avalanche photodiode can be formed by ion-implanting n-type impurity or p-type impurity into an n-type well layer 101 formed in each pixel by use of a mask corresponding to a pattern of each region.

The fixed charge films 114 and 115 include a film with positive or negative fixed charges. For example, the fixed charge films 114 and 115 are configured of a metal oxide film including oxide of aluminum, tantalum, zirconium, hafnium, yttrium, lanthanoid, or the like, or a metal nitride film including nitride of the above substances. Alternatively, the fixed charge films 114 and 115 are configured of a mix crystal-based film of oxide and nitride of the above substances.

The avalanche regions 104 are formed to extend in the thickness direction of the semiconductor substrate 107 as described above, and thus the depth of the avalanche regions 104 can be set depending on a wavelength of a light to be detected. Further, an incident light is sufficiently absorbed thereby to generate many carriers from photons due to avalanche multiplication.

Furthermore, a plurality of avalanche photodiode structures are repeatedly formed in one pixel, and thus the width of an avalanche region 104 between an n+ region 102 and a p+ region 103 can be reduced to be half or less than only one structure is employed. Consequently, an application voltage required for causing avalanche multiplication can be reduced. Thereby, the avalanche photodiodes can be applied also to a CMOS image sensor with relatively low drive voltage.

Further, a required application voltage is reduced thereby to restrict crosstalk with adjacent pixel or heat from being generated. Thereby, a thick insulating isolation region or Peltier device does not need to be provided, thereby realizing finer pixels of the solid-state image sensing device in the CMOS image sensor 10A.

On the other hand, with a comparison at the same application voltage, electric fields on the avalanche regions 104 can be made stronger than in one structure, and the number of carriers generated per photon can be increased. Thereby, responsiveness to the low amount of light can be enhanced. Thus, an improvement insensitivity to the low light level can be realized while a wide dynamic range is kept.

Further, the heights of the upper faces of the n+ regions 102, the p+ regions 103, and the avalanche regions 104 configuring an avalanche photodiode are almost the same, and thus almost-uniform electric fields are applied to the entire avalanche regions 104.

Furthermore, the fixed charge films 114 and 115 are provided thereby to prevent a fall voltage of the avalanche photodiode from being varied, or a dark current from being generated. This point will be described with reference to FIG. 4 and FIG. 5.

Figure 4:
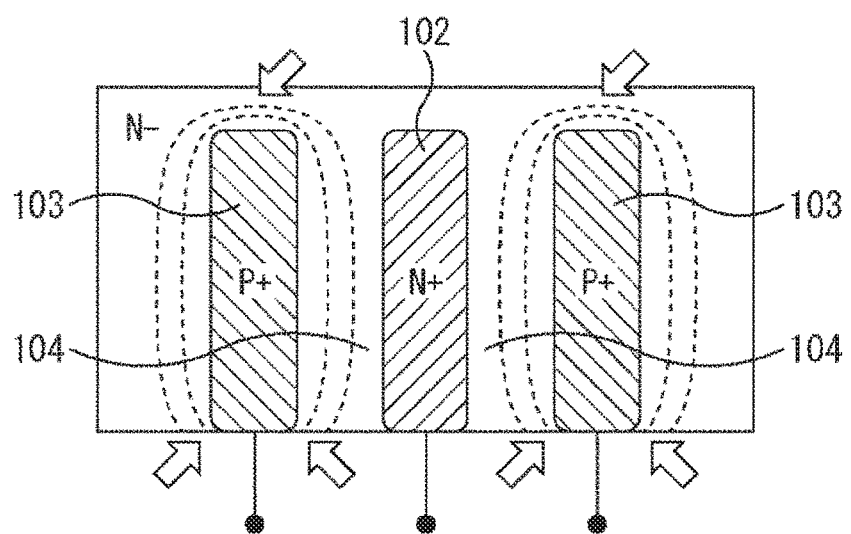
FIG. 4 is a diagram schematically illustrating a distribution of electric fields in an avalanche photodiode in a case where fixed charge films are not provide.
Figure 5:
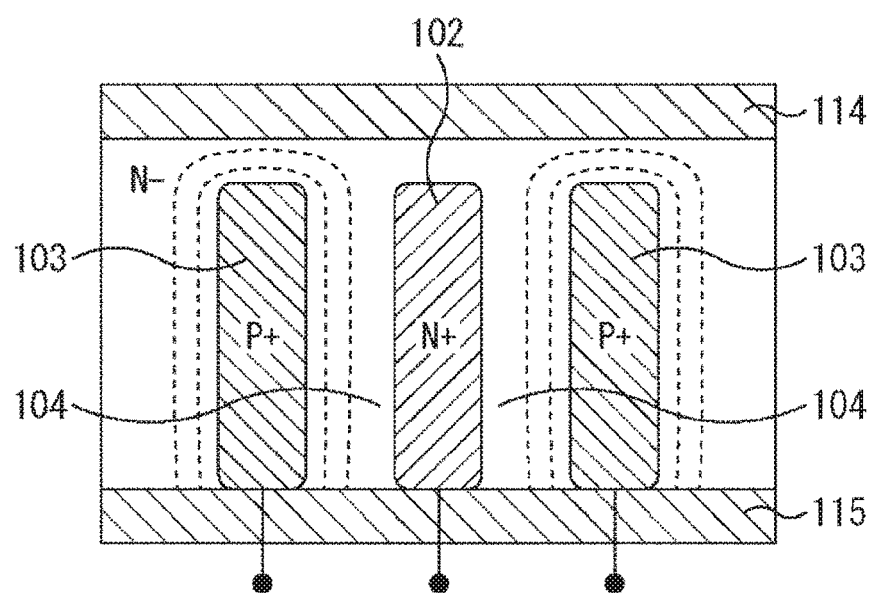
FIG. 5 is a diagram schematically illustrating a distribution of electric fields in an avalanche photodiode in a case where fixed charge films are provided.

FIG. 4 schematically illustrates a distribution of electric fields around the P+ regions 103 in an avalanche photodiode in a case where the fixed charge films 114 and 115 are not provided. FIG. 5 schematically illustrates a distribution of electric fields around the P+ regions 103 in an avalanche photodiode in a case where the fixed charge films 114 and 115 are provided. Additionally, the dotted lines around the p+ regions 103 in FIG. 4 and FIG. 5 indicate an equipotential line. Further, the n-type well layer 101 is not illustrated in FIG. 4 and FIG. 5.

As in the parts indicated by the arrows in FIG. 4, electric fields concentrate around the top side or backside of the semiconductor substrate 107 due to the shape or depth of the pn junction end of the avalanche photodiode, and surface pile-up or outward diffusion/suction of impurities on the semiconductor substrate 107. Consequently, a fall voltage of the avalanche photodiode varies or a dark current noise occurs around the top side or backside of the semiconductor substrate 107.

On the other hand, as illustrated in FIG. 5, the fixed charge films 114 and 115 are provided so that concentration of electric fields on the top side or backside of the semiconductor substrate 107 can be alleviated. Consequently, an influence due to the edge effect of the avalanche photodiode, the fringe effect of the avalanche photodiode, and the like is restricted.

Thereby, the fall voltage of the avalanche photodiode is stabilized and uniformly distributed. That is, the fall voltage at each position of the avalanche photodiode (each position particularly in the depth direction) is almost constant. Consequently, a reduction in light receiving sensitivity of the avalanche photodiodes can be prevented.

Further, the countermeasure that a low-concentration region is provided to alleviate an impurity concentration gradient, and the like are not made, and thus a reduction in light receiving sensitivity does not occur.

Therefore, the avalanche photodiodes with high sensitivity to incident lights ranging short wavelength to long wavelength are realized.

Further, a dark current is prevented from being generated around the top side and the backside of the semiconductor substrate 107 due to the surface pinning effect of the fixed charge films 114 and 115. Consequently, a noise-less image can be obtained.

<3. Second Embodiment>

A CMOS image sensor 10B as a second embodiment of the CMOS image sensor 10 of FIG. 1 will be described below with reference to FIG. 6.

{Exemplary Configuration of CMOS Image Sensor 10B}

Figure 6:
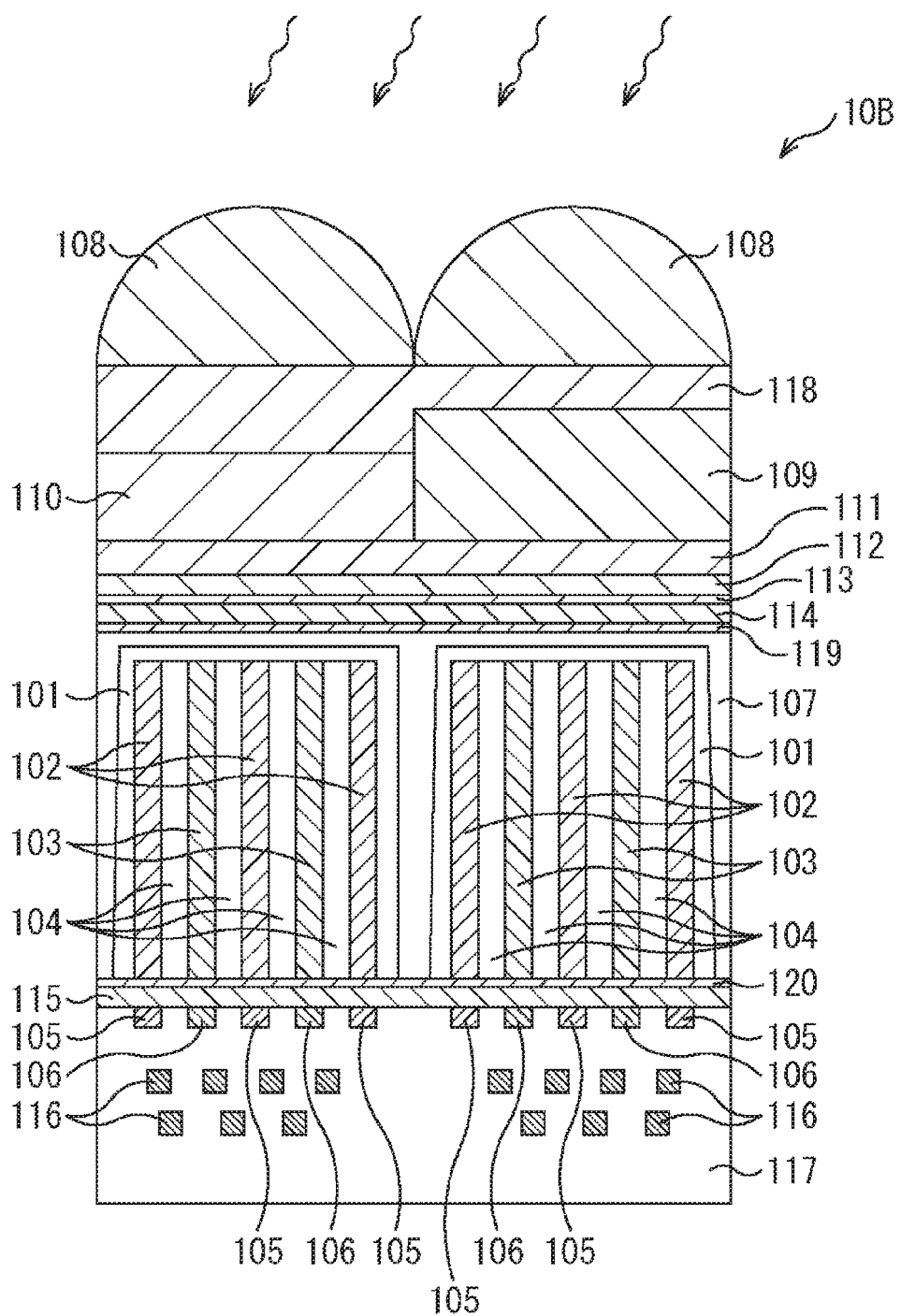
FIG. 6 is a cross-section view illustrating a second embodiment of the CMOS image sensor.

FIG. 6 is a cross-section view schematically illustrating an exemplary configuration of the CMOS image sensor 10B. Additionally, the same reference numerals are denoted to the parts corresponding to those in FIG. 2.

The CMOS image sensor 10B is different from the CMOS image sensor 10A of FIG. 2 in that insulating films 119 and 120 are added.

The insulating film 119 is formed between the semiconductor substrate 107 and the fixed charge film 114. The insulating film 120 is formed between the semiconductor substrate 107 and the fixed charge film 115.

The insulating film 119 is arranged between the semiconductor substrate 107 and the fixed charge film 114 in this way, thereby preventing the avalanche photodiodes and the fixed charge film 114 from being electrically short-circuited in a case where the fixed charge film 114 is conductive. Similarly, the insulating film 120 is arranged between the semiconductor substrate 107 and the fixed charge film 115, thereby preventing the avalanche photodiodes and the fixed charge film 115 from being electrically short-circuited in a case where the fixed charge film 115 is conductive.

<4. Third Embodiment>

A CMOS image sensor 10C as a third embodiment of the CMOS image sensor 10 of FIG. 1 will be described below with reference to FIGS. 7, 8A, 8B, 8C, 8D, 9E, 9F, and 9G.

{Exemplary Configuration of CMOS Image Sensor 10C}

Figure 7:
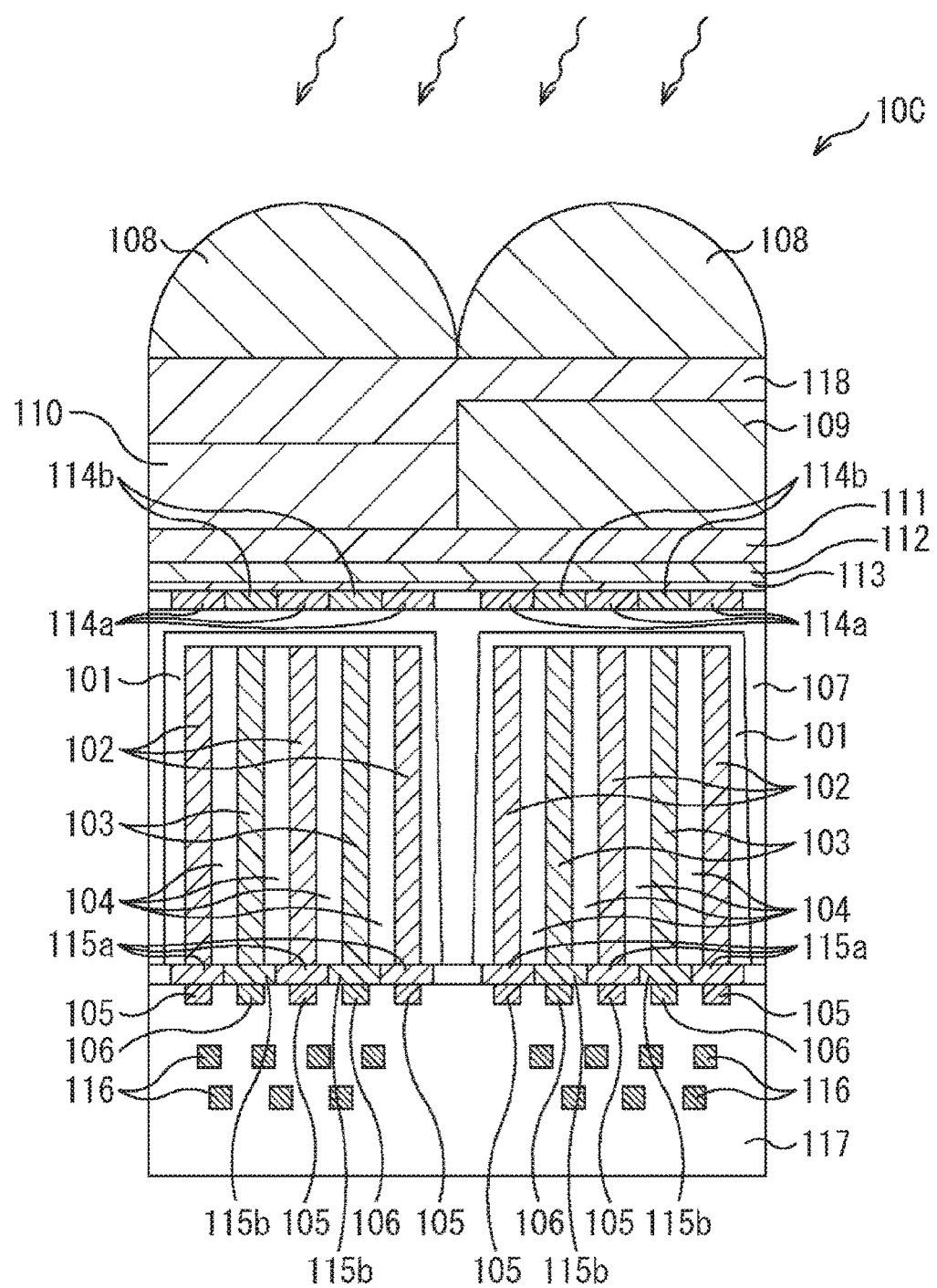
FIG. 7 is a cross-section view illustrating a third embodiment of the CMOS image sensor.

FIG. 7 is a cross-section view schematically illustrating an exemplary configuration of the CMOS image sensor 10C. Additionally, the same reference numerals are denoted to the parts corresponding to those in FIG. 2.

The CMOS image sensor 10C is different from the CMOS image sensor 10A of FIG. 2 in that fixed charge films 114a and 114b are formed instead of the fixed charge film 114 and fixed charge films 115a and 115b are formed instead of the fixed charge film 115.

The fixed charge films 114a and 114b are formed in the same layer as the fixed charge film 114 in the CMOS image sensor 10A of FIG. 2. However, the fixed charge film 114a is formed only near (above) the n+ regions 102. The fixed charge film 114b is formed only near (above) the p+ regions 103. The fixed charge films 114a and 114b are not formed in the inter-pixel parts where the n+ regions 102 and the p+ regions 103 are not formed.

The fixed charge film 115a and 115b are formed in the same layer as the fixed charge film 115 in the CMOS image sensor 10B of FIG. 2. However, the fixed charge film 115a is formed only near (below) the n+ regions 102. The fixed charge film 115b is formed only near (below) the p+ regions 103. The fixed charge films 115a and 115b are not formed in the inter-pixel parts where the n+ regions 102 and the p+ regions 103 are not formed.

Further, the fixed charge film 114a and the fixed charge film 115a include the same material, and have the same fixed charges. The fixed charge film 114b and the fixed charge film 115b include a different material from the fixed charge film 114a and the fixed charge film 115a, and have different fixed charges from the fixed charge film 114a and the fixed charge film 115a. Therefore, the fixed charges of the fixed charge films are different between near the n+ regions 102 and near the p+ regions 103.

Additionally, any of the exemplary materials of the fixed charge films 114 and 115 of FIG. 2 is employed for the fixed charge films 114a, 114b, 115a, and 115b, for example.

The fixed charge films with different fixed charges are appropriately arranged depending on the layout of the n+ regions 102 and the p+ regions 103, thereby appropriately alleviating concentration of electric fields.

Additionally, as illustrated in FIG. 7, a fixed charge film does not necessarily need to be provided in an inter-pixel part where concentration of electric fields does not need to be alleviated.

Additionally, an insulating film may be provided between the semiconductor substrate 107 and the fixed charge films 114a and 114b as well as between the semiconductor substrate 107 and the fixed charge films 115a and 115b in the CMOS image sensor 10C similarly as in the CMOS image sensor 10B of FIG. 6.

{Method for Manufacturing Fixed Charge Films 114a and 114b}

A method for manufacturing the fixed charge films 114a and 114b in the CMOS image sensor 10C will be described below with reference to FIGS. 8A, 8B, 8C, 8D, 9E, 9F, and 9G.

Additionally, FIGS. 8A, 8B, 8C, 8D, 9E, 9F, and 9G illustrate only the parts required for explaining the method for manufacturing the fixed charge films 114a and 114b. Further, the n-type well layer 101 is not illustrated.

At first, as illustrated in FIG. 8A, a silicon oxide (SiO2) film 201 is formed on the upper face of the semiconductor substrate 107.

Next, as illustrated in FIG. 8B, the silicon oxide film 201 is patterned. Thereby, openings 201A are formed in the silicon oxide film 201 above the p+ regions 103.

Next, as illustrated in FIG. 8C, the fixed charge film 114b is formed on the upper face of the semiconductor substrate 107 and the upper face of the silicon oxide film 201. At this time, the fixed charge film 114b is embedded in the openings 201A in the silicon oxide film 201.

Next, as illustrated in FIG. 8D, the fixed charge film 114b is polished by chemical mechanical polishing (CMP). Thereby, the fixed charge film 114b other than in the openings 201A in the silicon oxide film 201 is removed.

Figure 9E:
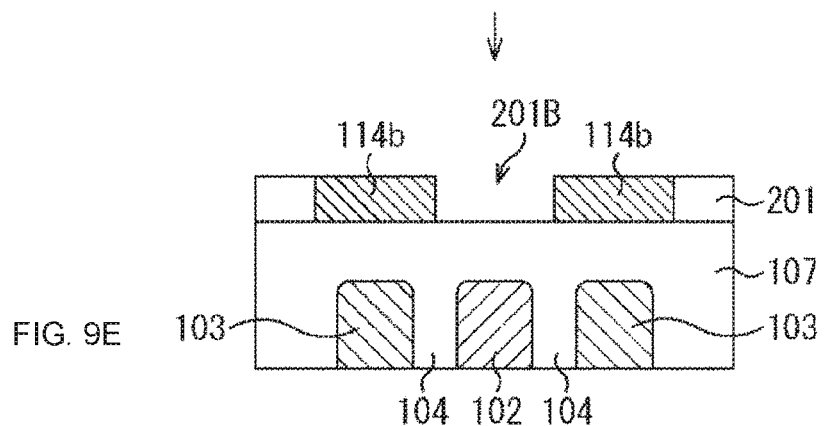
FIGS. 9E, 9F, and 9G are diagrams for explaining the method for manufacturing a fixed charge film of the CMOS image sensor of FIG. 7.

Next, as illustrated in FIG. 9E, the silicon oxide film 201 is patterned. Thereby, opening 201B are formed in the silicon oxide film 201 above the n+ regions 102.

Figure 9F:
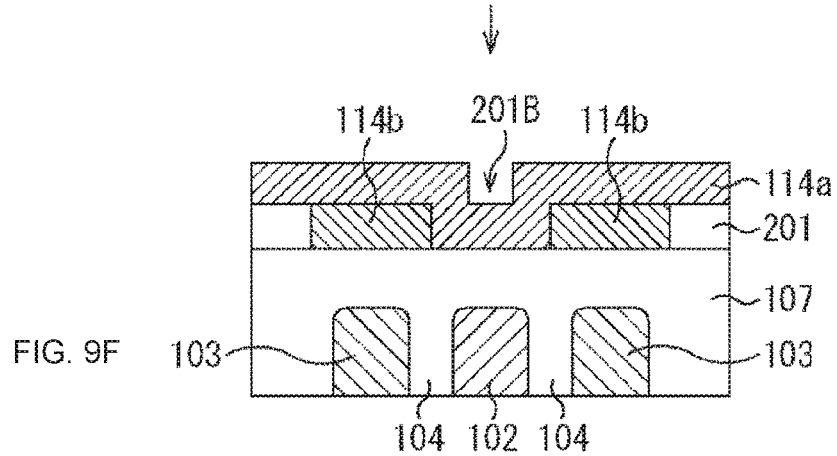

Next, as illustrated in FIG. 9F, the fixed charge film 114a is formed on the upper face of the semiconductor substrate 107 and the upper face of the silicon oxide film 201. At this time, the fixed charge film 114a is embedded in the openings 201B in the silicon oxide film 201.

Figure 9G:
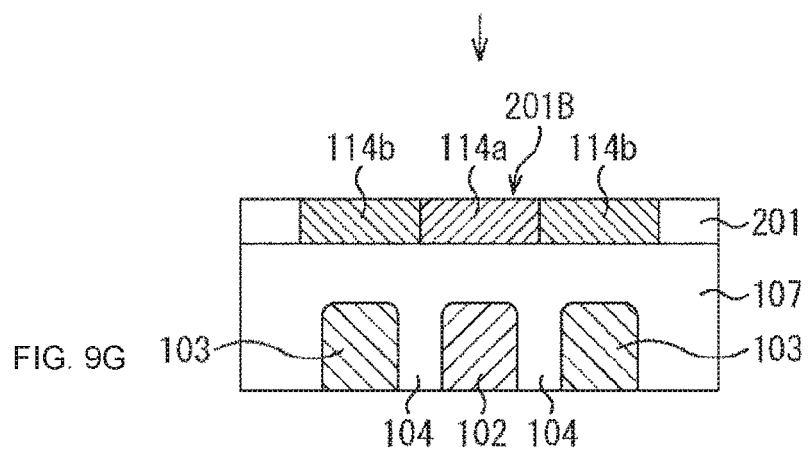

Next, as illustrated in FIG. 9G, the fixed charge film 114a is polished by CMP. Thereby, the fixed charge film 114a other than in the openings 201B in the silicon oxide film 201 is removed.

The fixed charge films 114a and 114b are formed in this way.

<5. Variants>

Variants of the aforementioned embodiments of the present technology will be described below.

{Variants of Plane Pattern of Avalanche Photodiode}

Variants of the plane pattern of the n+ regions 102, the p+ regions 103, and the avalanche regions 104 configuring an avalanche photodiode will be first described with reference to FIG. 10 to FIG. 13.

Figure 10:
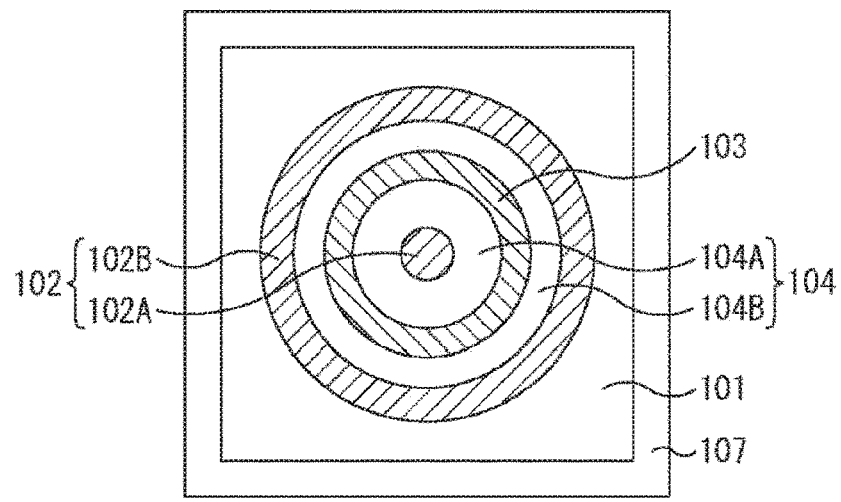

FIG. 10 illustrates a first variant of the horizontal cross-section view along the line A-A in FIG. 2. The horizontal direction in FIG. 10 corresponds to the horizontal direction in FIG. 2, and the vertical direction corresponds to a direction perpendicular to the sheet of FIG. 2 similarly as in FIG. 3.

In the example, the n+ regions 102 include n+ regions 102A and 102B. The avalanche regions 104 include avalanche regions 104A and 104B.

The n+ region 102A is a columnar region with a circular cross section, and is arranged at the center of a pixel. The n+ region 102B, the p+ region 103, and the avalanche regions 104A and 104B are cylindrical regions with a circle-framed cross section. The avalanche region 104A, the p+ region 103, the avalanche region 104B, and the n+ region 102B are then arranged from the inside in this order such that each region concentrically surrounds the n+ region 102A.

Figure 11:
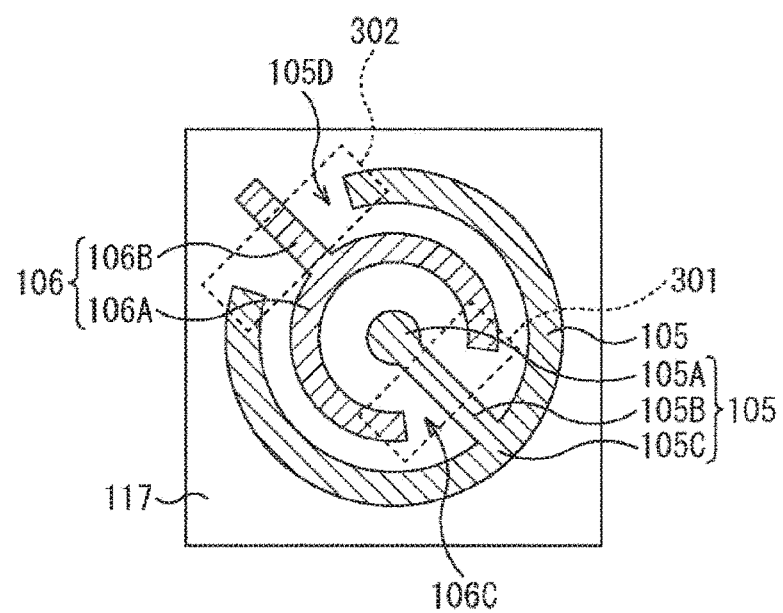

FIG. 11 illustrates a horizontal cross-section view along the line B-B in FIG. 2. The horizontal direction in FIG. 11 corresponds to the horizontal direction in FIG. 2, and the vertical direction corresponds to a direction perpendicular to the sheet of FIG. 2 similarly as in FIG. 3 and FIG. 10.

The electrodes 105 include an electrode 105A, a connection part 105B, and an electrode 105C. The electrodes 106 include an electrode 106A and a connection part 106B.

The cross section of the electrode 105A has a substantially similar shape to the n+ region 102A in FIG. 10, and is connected to the n+ region 102A via a wiring or the like (not illustrated). The cross section of the electrode 105C is an arc-shaped region along the bottom (circular frame) of the n+ region 102B in FIG. 10, and is connected to the n+ region 102B via a wiring or the like (not illustrated). Further, the electrode 105C is formed with a discontinuous part 105D where part of the arc is discontinuous.

The cross section of the electrode 106A is an arc-shaped region along the bottom (circular frame) of the p+ region 103 in FIG. 10, and is connected to the p+ region 103 via a wiring or the like (not illustrated). Further, the electrode 106A is formed with a discontinuous part 106C where part of the arc is discontinuous.

The electrode 105A and the electrode 105C are connected via the connection part 105B with a linear cross section through the discontinuous part 106C in the electrode 106A. The electrode 106A is connected to a wiring or the like (not illustrated) at the circumferential edge of the pixel through the discontinuous part 105D in the electrode 105C via the connection part 106B with a linear cross section.

In the example, electric fields easily occur near the discontinuous part 105D in the electrode 105C at the lower end of the n+ region 102B connected to the electrode 105C. Further, electric fields easily occur near the discontinuous part 106C in the electrode 106A at the lower end of the p+ region 103 connected to the electrode 106A.

Thus, for example, the fixed charge film 115 may be arranged only in a region 301 and a region 302 surrounded in dotted lines in FIG. 11 between the semiconductor substrate 107 and the insulating layer 117. Additionally, the region 301 coverts at least above the discontinuous part 106C. The region 302 coverts at least above the discontinuous part 105D.

Additionally, for example, the fixed charges of the fixed charge film 115 may be changed between the region 301 and the region 302 depending on a difference in polarity between the p+ region 103 and the n+ region 102B.

Alternatively, for example, the material of the fixed charge film 115 may be changed between the regions 301, 302 and other regions.

Figure 12:
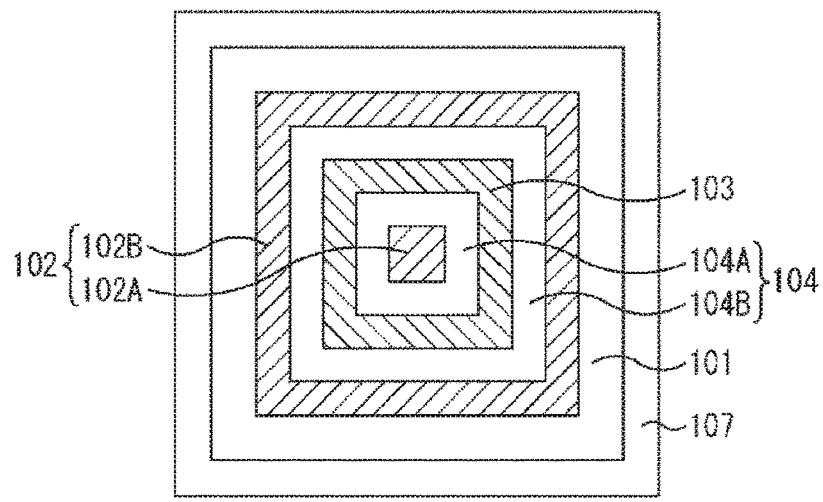

FIG. 12 illustrates a second variant of the horizontal cross-section view along the line A-A in FIG. 2. The horizontal direction in FIG. 12 corresponds to the horizontal direction in FIG. 2, and the vertical direction corresponds to a direction perpendicular to the sheet of FIG. 2 similarly as in FIG. 3.

In the example, the n+ regions 102 include n+ regions 102A and 102B. The avalanche regions 104 include avalanche regions 104A and 104B.

The n+ region 102A is a quadrangular-prism-shaped region with a rectangular cross section, and is arranged at the center of a pixel. The n+ region 102B, the p+ region 103, and the avalanche regions 104A and 104B are quadrangular-prism-shaped regions with a rectangular-framed cross section. The avalanche region 104A, the p+ region 103, the avalanche region 104B, and the n+ region 102B are then arranged from the inside in this order such that each region surrounds the n+ region 102A in a frame shape.

In the example, electric fields easily concentrate near the corners of the n+ region 102A and near the corners of the p+ region 103.

Thus, for example, the fixed charge films 114 and 115 may be arranged only in regions 321a to 321d and regions 322a to 322d surrounded in dotted lines in FIG. 11. Additionally, the regions 321a to 321d cover at least near the corners of the n+ region 102A. The regions 322a to 322d cover at least near the corners of the p+ region 103.

Additionally, the fixed charges of the fixed charge film 114 may be changed between the regions 321a to 321d and the regions 322a to 322d depending on a difference in polarity between the n+ region 102A and the p+ region 102B. Similarly, the fixed charges of the fixed charge film 115 may be changed between the regions 321a to 321d and the regions 322a to 322d.

Alternatively, the material of the fixed charge films 114 and 115 may be changed between the regions 321a to 321d and the regions 322a to 322d.

Additionally, in the examples of FIG. 10 and FIG. 12, the outermost region in an avalanche photodiode structure in each pixel is limited to the n+ region 102B. Therefore, the outermost regions in adjacent pixels are of the same conductive type, and insulating isolation between the pixels is facilitated.

Further, the plane pattern of the n+ regions 102, the p+ regions 103, and the avalanche regions 104 configuring an avalanche photodiode is not limited to the above example, and may be other plane pattern. As in the examples in FIG. 3, FIG. 10, and FIG. 12, however, it is preferable to repeat a simple-shape pattern. A simple-shape pattern enables a margin corresponding to mask offset in ion implantation to be secured, thereby easily decreasing the pattern width and lowering the voltage.

Furthermore, for example, the n+ regions 102 and the p+ regions 103 may be arranged in a reverse way to the above example. Further, for example, the number of repetitions of the n+ regions 102, the p+ regions 103, and the avalanche regions 104 may be increased or decreased.

Further, in the examples described above with reference to FIG. 10 and FIG. 11, for example, in a case where two or more discontinuous parts are present in an electrode, the fixed charge films may be arranged to cover at least around each discontinuous part. Further, for example, also in a case where a discontinuous part is formed in an electrode in a frame shape (such as rectangle) other than arc shape, the fixed charge films may be arranged to cover at least around each discontinuous part.

Figure 13:
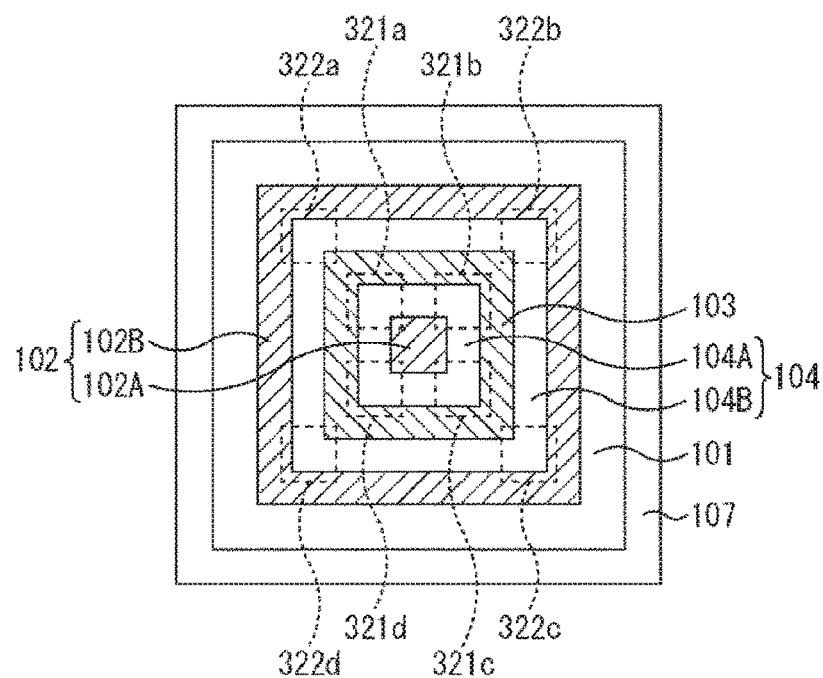

Furthermore, for example, in a case where the cylindrical n+ regions or p+ regions in a prism shape other than quadrangular prism shape or in a polygonal shape other than rectangular shape are provided in an avalanche photodiode structure, the fixed charge films may be arranged to cover at least around the corners of each region similarly as in the examples described with reference to FIG. 12 and FIG. 13.

{Other Variants}

The above embodiments have been described assuming that the present technology is applied to a CMOS image sensor in which unit pixels are arranged in a matrix shape, but the present technology is not limited to the CMOS image sensor. That is, the present technology is applicable to general solid-state image sensing devices including avalanche photodiodes extending in the thickness direction of a semiconductor substrate.

Further, the present technology is applicable to solid-state image sensing devices of backside irradiation type.

Furthermore, the above description demonstrates the example in which the fixed charge films are provided on both the top side and the backside of the semiconductor substrate, but a fixed charge film may be provided on either side.

Further, a solid-state image sensing device to which the present technology is applied, for example, may be formed as one chip, or may be in a module shape having an imaging function in which an imaging unit, and a signal processing unit or an optical system are collectively packaged.

<6. Exemplary Use of Solid-State Image Sensing Devices>

Figure 14:
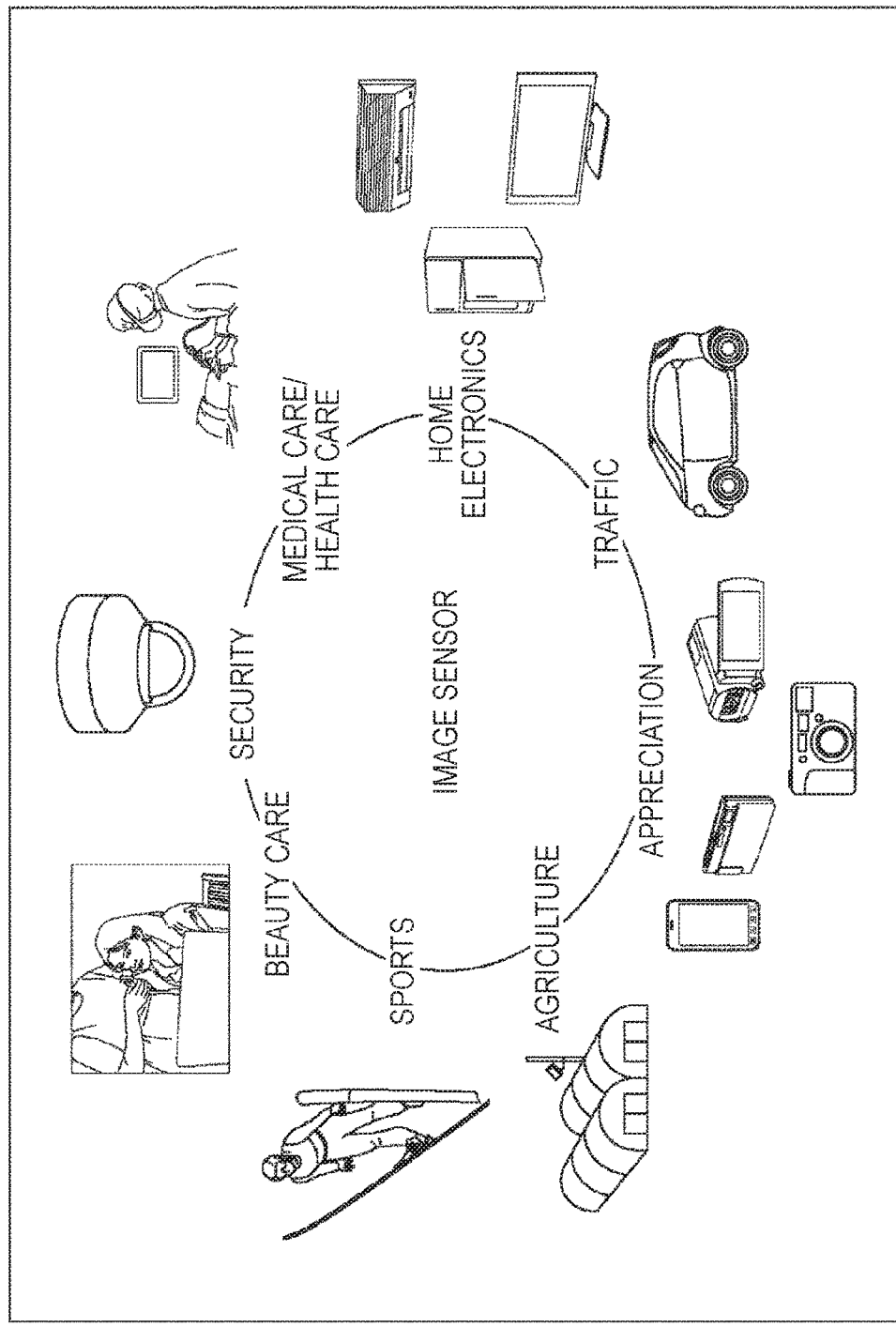

FIG. 14 is a diagram illustrating exemplary use of the above solid-state image sensing devices.

The above solid-state image sensing devices can be used in various cases for sensing a visible ray, an infrared ray, an ultraviolet ray, an X ray, and the like as described below, for example.

- Devices for shooting images to be appreciated such as digital camera and camera-mounted cell phone
- Traffic devices for safe driving such as automatic stop, or recognition of driver's states and the like, such as vehicle-mounted sensor for shooting such as in front of, behind, around, and inside an automobile, monitoring camera for monitoring traveling vehicles or roads, and distance measurement sensor for measuring an inter-vehicle distance and the like
- Devices for home electronics such as TV, refrigerator, and air conditioner for shooting a user's gesture and performing an equipment operation according to the gesture
- Devices for medical care or health care such as endoscope and device for performing angiography by received infrared ray
- Security devices such as monitoring camera for security and camera for person authentication
- Beauty care devices such as skin measurement device for shooting the skin and microscope for shooting the scalp
- Sports devices such as action camera or wearable camera for sports and the like
- Agricultural devices such as camera for monitoring states of fields and crops {Shooting Device}

Figure 15:
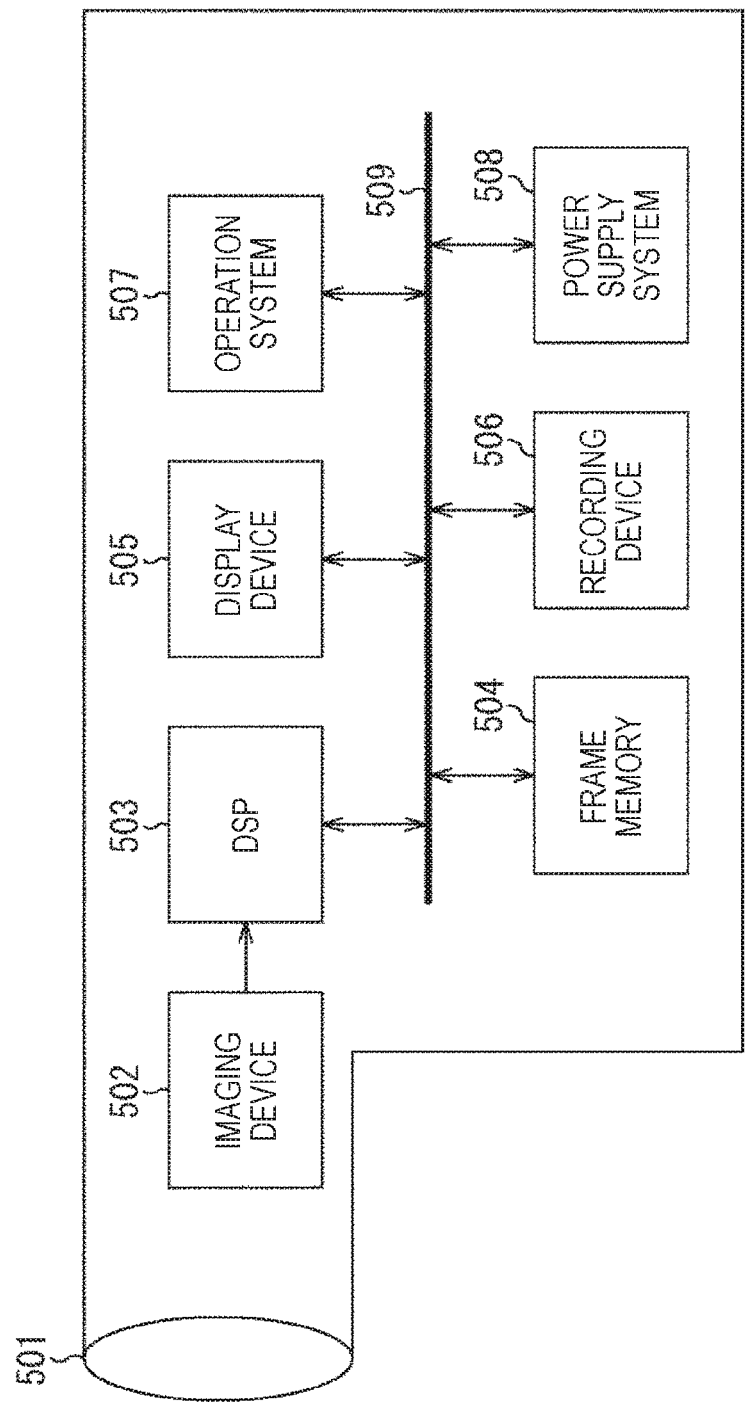

FIG. 15 is a block diagram illustrating an exemplary configuration of a shooting device (camera device) as an exemplary electronic device to which the present technology is applied.

As illustrated in FIG. 15, a shooting device includes an optical system including a group of lenses 501 and the like, an imaging device 502, a DSP circuit 503 as camera signal processing unit, a frame memory 504, a display device 505, a recording device 506, an operation system 507, a power supply system 508, and the like. Furthermore, the DSP circuit 503, the frame memory 504, the display device 505, the recording device 506, the operation system 507, and the power supply system 508 are mutually connected via a bus line 509.

The group of lenses 501 takes an incident light (image light) from a subject and forms an image on an imaging face of the imaging device 502. The imaging device 502 converts the amount of incident light formed on the imaging face by the group of lenses 501 into an electric signal in units of pixel, and outputs the electric signal as pixel signal.

The display device 505 is configured of a panel-type display device such as liquid crystal display device or electro luminescence (EL) display device, and displays an animation or still image shot by the imaging device 502. The recording device 506 records the animation or still image shot by the imaging device 502 in a recording medium such as memory card, video tape, or digital versatile disk (DVD).

The operation system 507 issues operation instructions to various functions in the shooting device in response to user's operations. The power supply system 508 supplies power to various power supplies as operation power supplies of the DSP circuit 503, the frame memory 504, the display device 505, the recording device 506, and the operation system 507 as needed.

The shooting device is applied to camera modules for mobile devices such as video camera, digital still camera, Smartphone, and cell phone. Then, a solid-state image sensing device according to each embodiment can be used as the imaging device 502 in the shooting device. Thereby, image quality of the shooting device can be enhanced.

Additionally, embodiments of the present technology are not limited to the above embodiments, and can be variously modified without departing from the spirit of the present technology.

Further, the present technology can employ the following configurations, for example.

(1)

A solid-state image sensing device including:

an avalanche photodiode having a first region of a first conductive type, a second region of a second conductive type different from the first conductive type, and an avalanche region sandwiched between the first region and the second region, which extend in a thickness direction of a semiconductor substrate; and a film formed on at least one side of the semiconductor substrate and including a metal oxide film, a metal nitride film, or a mix crystal-based film of metal oxide film and metal nitride film.

(2)

The solid-state image sensing device according to (1), further including:

an insulating film formed between the film and the semiconductor substrate.

(3)

The solid-state image sensing device according to (1) or (2), in which the film includes an oxide film or nitride film of aluminum, tantalum, zirconium, hafnium, yttrium, or lanthanoid, or a mix crystal-based film of oxide and nitride of aluminum, tantalum, zirconium, hafnium, yttrium, or lanthanoid.

(4)

The solid-state image sensing device according to any of (1) to (3),
in which the film has fixed charges.

(5)

The solid-state image sensing device according to (4), in which the film has different fixed charges between near the first region and near the second region.

(6)

The solid-state image sensing device according to any of (1) to (5),
in which in a case where the first region is in a rectangular tube shape, the film is formed to cover at least around corners of the first region.

(7)

The solid-state image sensing device according to any of (1) to (6),
in which the first region is cylindrical,
an electrode formed along the upper face or the bottom face of the first region and having one or more discontinuous parts is further provided on one side of the semiconductor substrate, and
the film is formed to cover at least around the discontinuous parts in the electrode between the semiconductor substrate and the electrode.

(8)

The solid-state image sensing device according to any of (1) to (7),
in which two or more avalanche photodiode structures are repeatedly formed in one pixel.

(9)

A method for manufacturing a solid-state image sensing device, the method including:
a step of forming a film including a metal oxide film, a metal nitride film, or a mix crystal-based film of metal oxide film and metal nitride film on at least one side of a semiconductor substrate on which an avalanche photodiode having a first region of a first conductive type, a second region of a second conductive type different from the first conductive type, and an avalanche region sandwiched between the first region and the second region, which extend in a thickness direction of the semiconductor substrate, is formed.

(10)

An electronic device including:
a solid-state image sensing device; and
a signal processing unit that processes a signal output from the solid-state image sensing device,
in which the solid-state image sensing device includes:
an avalanche photodiode having a first region of a first conductive type, a second region of a second conductive type different from the first conductive type, and an avalanche region sandwiched between the first region and the second region, which extend in a thickness direction of a semiconductor substrate; and
a film formed on at least one side of the semiconductor substrate and including a metal oxide film, a metal nitride film, or a mix crystal-based film of metal oxide film and metal nitride film.

REFERENCE SIGNS LIST 10, 10A to 10C: CMOS image sensor
11: Pixel array part
101: n-type well layer
102, 102A, 102B: n+ region
103: p+ region
104, 104A, 104B: Avalanche region
105, 105A, 105C: Electrode
105B: Connection part
105D: Discontinuous part
106, 106A: Electrode
106C: Discontinuous part
107: Semiconductor substrate
114, 114a, 114b, 115, 115a, 115b: Fixed charge film
119, 120: Insulating film
301, 302, 321, 322: Region

The invention claimed is:

1. A solid-state image sensing device, comprising:
a semiconductor substrate;
an avalanche photodiode on the semiconductor substrate, wherein the avalanche photodiode comprises:
a first region of a first conductive type,
a second region of a second conductive type, wherein the second conductive type is different from the first conductive type, and
an avalanche region between the first region and the second region, wherein the first region, the second region, and the avalanche region extend in a thickness direction of the semiconductor substrate;
a first film on a first side of the semiconductor substrate; and
a second film on a second side of the semiconductor substrate, wherein each of the first film and the second film includes at least one of a metal oxide film or a metal nitride film.

2. The solid-state image sensing device according to claim 1, further comprising:
a first insulating film between the first film and the semiconductor substrate; and
a second insulating film between the second film and the semiconductor substrate.

3. The solid-state image sensing device according to claim 1, wherein:
the metal oxide film comprises one of aluminum, tantalum, zirconium, hafnium, yttrium, or lanthanoid, and
the metal nitride film comprises one of aluminum, tantalum, zirconium, hafnium, yttrium, or lanthanoid.

4. The solid-state image sensing device according to claim 1, wherein the first film has fixed charges.

5. The solid-state image sensing device according to claim 4, wherein the first film has different fixed charges between near the first region and near the second region.

6. The solid-state image sensing device according to claim 1, wherein in a case where the first region is in a rectangular tube shape, the first film covers at least around corners of the first region.

7. The solid-state image sensing device according to claim 1, further comprising:
an electrode along one of an upper face or a bottom face of the first region, wherein:
the first region is cylindrical,
the electrode includes at least one discontinuous part on one side of the semiconductor substrate,
the first film covers at least around the at least one discontinuous part in the electrode, and
the first film is between the semiconductor substrate and the electrode.

8. The solid-state image sensing device according to claim 1, wherein at least two avalanche photodiode structures are repeated in one pixel.

9. A method for manufacturing a solid-state image sensing device, the method comprising:
forming a semiconductor substrate;

forming a first film on a first side of the semiconductor substrate;

forming a second film on a second side of the semiconductor substrate,
wherein each of the first film and the second film includes at least one of a metal oxide film or a metal nitride film; and forming an avalanche photodiode on the semiconductor substrate, wherein the avalanche photodiode comprises:
a first region of a first conductive type,
a second region of a second conductive type, wherein the second conductive type is different from the first conductive type, and
an avalanche region between the first region and the second region, wherein the first region, the second region, and the avalanche region extend in a thickness direction of the semiconductor substrate.

10. An electronic device, comprising:
a solid-state image sensing device; and
a signal processing unit configured to process a signal output from the solid-state image sensing device,
wherein the solid-state image sensing device includes:
a semiconductor substrate;
an avalanche photodiode on the semiconductor substrate, wherein the avalanche photodiode comprises:
a first region of a first conductive type,
a second region of a second conductive type, wherein the second conductive type is different from the first conductive type, and
an avalanche region between the first region and the second region, wherein the first region, the second region, and the avalanche region extend in a thickness direction of the semiconductor substrate;
a first film on a first side of the semiconductor substrate; and
a second film on a second side of the semiconductor substrate, wherein each of the first film and the second film includes at least one of a metal oxide film or a metal nitride film.

11. A solid-state image sensing device, comprising:
on-chip lenses;
a semiconductor substrate including:
a first region of a first conductive type,
a second region of a second conductive type, wherein the second conductive type is different from the first conductive type, and
an avalanche region between the first region and the second region;
metal wiring layers;
a first film between the on-chip lenses and the semiconductor substrate; and
a second film between the metal wiring layers and the semiconductor substrate,
wherein each of the first film and the second film includes at least one of a metal oxide or a metal nitride.

\* \* \* \* \*